United States Patent [19]

Ogawa et al.

[11] 4,370,624
[45] Jan. 25, 1983

[54] LOW NOISE AMPLIFIER CIRCUIT WITH REDUCED LOW-FREQUENCY GAIN

[75] Inventors: Tadao Ogawa, Hino; Nobuhide Yamaguchi, Tokyo, both of Japan

[73] Assignee: Fujitsu Limited, Kawasaki, Japan

[21] Appl. No.: 211,050

[22] Filed: Nov. 28, 1980

[30] Foreign Application Priority Data

Nov. 28, 1979 [JP] Japan ................................ 54-154035

[51] Int. Cl.³ .......................................... H03F 1/34
[52] U.S. Cl. .................................. 330/294; 330/304
[58] Field of Search ................... 330/94, 109, 86, 294, 330/102, 304; 179/1 P

[56] References Cited

U.S. PATENT DOCUMENTS 3,938,057  2/1976  Minot ................................. 330/102

Primary Examiner—James B. Mullins
Assistant Examiner—Gene Wan
Attorney, Agent, or Firm—Staas & Halsey

[57] ABSTRACT

A low noise amplifier, comprising a grounded emitter transistor amplifier having a parallel impedance element connected between base and collector and a series impedance element connected between emitter and ground. The parallel impedance element is selected to have a pole near a zero of the series impedance element, and the parallel impedance element also has a zero near a pole of the series impedance element. The impedances of the series impedance element and of the parallel impedance element vary oppositely with respect to frequency, so that the input impedance of the amplifier is constant with respect to frequency. However, by selection of two impedances which are thus matched, the gain is increased at high frequencies and slightly reduced at low frequencies. Thus, the total noise figure is improved, due to the higher gain at the higher frequency range. In addition, frequency-selective attenuation imposed by a transmission line is compensated for, so that the amplifier has increased immunity to low-frequency overload.

5 Claims, 9 Drawing Figures

LOW NOISE AMPLIFIER CIRCUIT WITH REDUCED LOW-FREQUENCY GAIN

CROSS REFERENCE TO RELATED APPLICATIONS

Priority under 35 U.S.C. §119 is claimed for this application based on Japanese Patent Application No. Tokugansho 54-154035, filed on Nov. 28, 1979, in Japan.

BACKGROUND OF THE INVENTION

This invention relates to a low noise amplifier circuit, suitable for use as the initial stage amplifier in a regenerative repeater used in a digital transmission system. A digital transmission system, which transmits digital signals using, e.g., coaxial cable or balanced cable as a transmission path, provides regenerative repeaters periodically along the transmission path, to regenerate and repeat the signal pulses which have been attenuated or distorted over the transmission path. The initial stage amplifier of such a repeater is required to have an input impedance which is equal to the characteristic impedance of the transmission line over a broad frequency range, and is also required to have a low noise figure.

FIG. 1 shows a conventional transistor amplifier used in such an input stage. In this circuit, input impedance matching is achieved by the parallel resistance $R_F$ together with a series resistance $R_E$. Although this circuit attains input impedance matching and a reasonably low noise figure, it does not avoid the following disadvantages:

1. The values of $R_F$ and $R_E$ must be selected in a certain relation in order to attain input impedance matching, and this relation prevents optimization of the noise figure of the circuit.
2. The gain of the initial stage amplifier must be large, in order to reduce the influence of noise on the amplifier in the next stage. However, since the circuit of FIG. 1 has a constant gain for all relevant frequencies, increase of the amplifier gain causes an increased probability of low frequency overload, since the transmission path will tend to attenuate the higher frequencies to a greater degree. Thus, the hazard of low frequency overload precludes increasing the gain beyond a certain point, and the noise figure can therefore be improved by increased gain only up to a certain point.

SUMMARY OF THE INVENTION

The present invention eliminates the above disadvantages of the conventional amplifier circuit, and the object of the invention is to offer an initial stage amplifier which shows a constant input impedance for a broad frequency range, with a lower noise figure and with satisfactory immunity to low frequency overload.

To achieve the foregoing objectives and in accordance with the purpose of the invention, as embodied and broadly described herein, the low noise amplifier circuit of the present invention comprises a grounded emitter type transistor amplifier circuit, having a parallel feedback loop between the collector and the base and having a series feedback loop between the emitter and ground, wherein the parallel feedback loop includes an element which has low impedance at low frequencies and high impedance at high frequencies, and wherein the series feedback loop includes an element which shows high impedance at low frequencies and low impedance at high frequencies.

BRIEF DESCRIPTION OF THE DRAWING

The accompanying drawings, which are incorporated in and constitute a part of the specification, illustrate embodiments of the invention, and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings.

Figure 1:
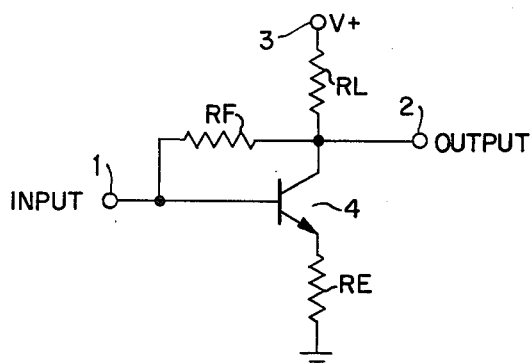
FIG. 1 is a circuit diagram of a conventional transistor amplifier, where a pure resistance $R_F$ is connected between a base and collector, and a pure resistance $R_E$ is connected between an emitter and ground.
Figure 2:
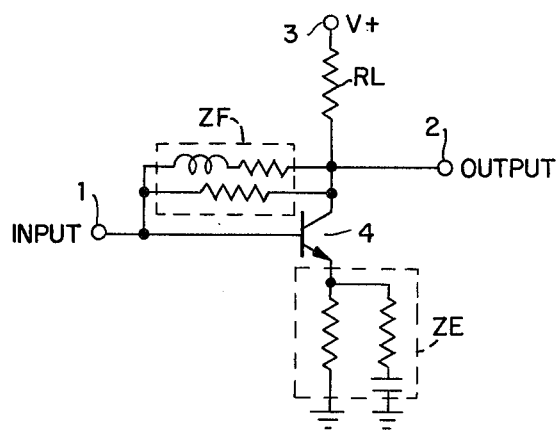
FIG. 2 is a circuit diagram of an embodiment of the low noise amplifier circuit according to the present invention, wherein, in a grounded emitter transistor amplifier, a parallel impedance element $Z_F$ having a complex impedance is connected between base and collector, and wherein a series impedance element $Z_E$ having a complex impedance is connected between emitter and ground.

FIG. 2 is a schematic diagram indicating the structure of an embodiment of a low noise amplifier circuit of this invention. In this figure, components which are similar to those in the circuit shown in FIG. 1 are given the same symbols. $Z_F$ is a parallel impedance and $Z_E$ is a series impedance.

In accordance with the invention, there is provided a ground-emitter transistor amplifier comprising a complex parallel impedance connected between base and collector and a complex series impedance connected between emitter and ground. As embodied herein and as shown in FIG. 2, a parallel impedance element $Z_F$ connected between the base and collector of transistor 4 has an impedance magnitude $|Z_F|$ which becomes high at a high frequency or low at a low frequency. In addition, a series impedance $Z_E$ inserted between the emitter and the ground of transistor 4 has an impedance magnitude $|Z_E|$ which becomes high at a low frequency or low at a high frequency. The parallel impedance $Z_F$ and the series impedance $Z_E$ are selected in such relation that the zero point of the parallel impedance $Z_F$ is close to the pole of the series impedance $Z_E$, while the pole of the parallel impedance $Z_F$ is close to the zero point of the series impedance $Z_E$.

Figure 3:
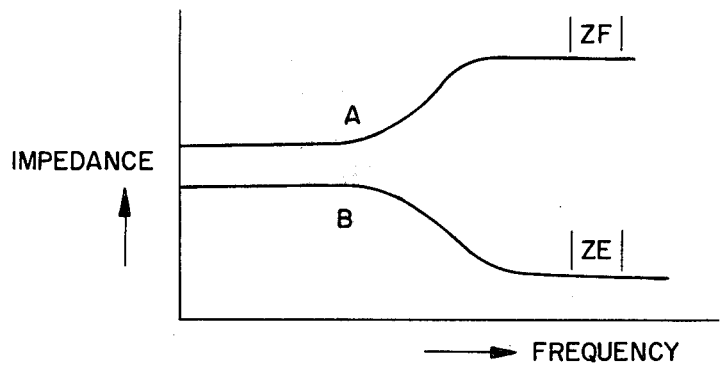
FIG. 3 shows impedance versus frequency curves for elements $Z_F$ and $Z_E$ suitable for use in the circuit of FIG. 2 of the present invention.

FIG. 3 shows the frequency characteristics of the parallel impedance $Z_F$ and the series impedance $Z_E$. In this figure, curve A indicates the absolute value $|Z_F|$ of the parallel impedance $Z_F$, while curve B indicates the absolute value $|Z_E|$ of the series impedance $Z_E$. As indicated by the curves A and B of FIG. 3, the frequency where the impedance $|Z_F|$ begins to rise is almost equal to the frequency where $|Z_E|$ begins to fall, and the frequency where the impedance $|Z_F|$ becomes constant is almost equal to the frequency where the impedance $|Z_E|$ becomes constant. In these curves, the impedance elements $Z_E$ and $Z_F$ each have a first constant magnitude at high frequencies, and the impedance magnitude of each changes smoothly to a second constant value at low frequencies, in accordance with the configuration of elements $Z_E$ and $Z_F$ shown in FIG. 2. In FIG. 2, the impedance elements $Z_F$ and $Z_E$ are embodied respectively as a resistor connected in parallel to the series circuit of an inductance and resistance and a resistor connected in parallel to the series circuit of a capacitor and resistor, to illustrate the simplest case where these impedances are represented by ratios of linear polynomials. But in general, these impedances can be selected freely under the conditions that (1) the impedance magnitude $|Z_F|$ becomes large as the frequency becomes high, (2) the impedance magnitude $|Z_E|$ becomes low as the frequency becomes low, and (3) the pole of $Z_F$ and zero of $Z_E$ are almost equal, as are the zero of $Z_F$ and the pole of $Z_E$.

The properties of the amplifier of this invention are explained below.

First of all, when the parallel impedance $|Z_F|$ is infinite, that is, when the parallel feedback loop does not exist and only the series feedback loop consisting of a series impedance $Z_E$ exists, the input impedance $Z_{ins}$ and the gain $G_s$ are approximately expressed as follows:

$$Z_{ins} \simeq \beta Z_E \qquad (1)$$

$$G_s \simeq -R_L/Z_E \qquad (2)$$

In the above equations, $\beta$ is the current amplification factor of the grounded emitter transistor 4. When impedance $Z_E$ has the circuit structure indicated in FIG. 2, the input impedance $Z_{ins}$ becomes large for a low frequency but becomes small for a high frequency, while the gain $G_s$ becomes small for a high frequency but large for a high frequency.

When series impedance $Z_E$ is zero, that is, when the series feedback loop does not exist and only the parallel feedback loop consisting of a parallel impedance $Z_F$ exists, the input impedance $Z_{inP}$ and the gain $G_P$ are approximately expressed as follows:

$$Z_{inP} \simeq \frac{\beta r_e Z_F}{Z_F + \beta R_L} \qquad (3)$$

$$G_P \simeq \frac{R_L Z_F}{r_e (Z_F + R_L)} \qquad (4)$$

In the above equations, $r_e$ is the emitter resistance of the transistor 4, and is usually several ohms to several tens of ohms. In the equation (3), the impedance $Z_F$ is usually selected considerably larger than a load resistance $R_L$ but smaller than $\beta R_L$. Therefore the input impedance $Z_{inP}$ is approximately expressed, by omitting the term $Z_F$ from the denominator of equation (3), as follows:

$$Z_{inP} = \frac{r_e Z_F}{R_L} \qquad (5)$$

Thus an input inpedance $Z_{inP}$ is almost proportional to the parallel impedance $Z_F$, and when the impedance $Z_F$ has the structure indicated in FIG. 2, the input impedance $Z_{inP}$ is small for a low frequency but large for a high frequency.

By transforming the equation (4), the gain $G_P$ can be expressed as follows:

$$G_P = \frac{-1}{r_e \left( \frac{1}{Z_F} + \frac{1}{R_L} \right)} \qquad (6)$$

From the equation (6), it can be understood that a gain $G_P$ is proportional to a parallel impedance of impedance $Z_F$ and load resistance $R_L$. Therefore, when the impedance $Z_F$ has the structure indicated in FIG. 2, the gain $G_P$ is small for a low frequency but large for a high frequency.

As may be understood from the above discussions, when both a parallel impedance $Z_F$ and a series impedance $Z_E$ exist, the input impedance becomes almost constant at low frequencies and high frequencies, because the frequency-dependent impedance effects of parallel impedance $Z_F$ and series impedance $Z_E$ cancel each other. On the other hand, the gain becomes small for low frequencies but large for high frequencies, because the frequency-dependant gain effects of parallel impedance $Z_F$ and series impedance $Z_E$ are mutually reinforced.

The noise figure will now be discussed. Generally, the noise figure of the circuit indicated in FIG. 2 is small, since impedance magnitude $|Z_F|$ is large and impedance $|Z_E|$ is small. Therefore, when impedance elements $Z_F$ and $Z_E$ have the structures indicated in FIG. 2, the noise figure becomes smaller at high frequencies. Since total noise is proportional to a value obtained by integrating a noise figure for the operating frequency range, reduction of the noise figure at high frequencies also reduces total noise. Thus, the total noise of the amplifier circuit of this invention becomes smaller than when impedances $Z_F$ and $Z_E$ are composed only of resistors.

The influence of noise on the next state will now be discussed. Generally, when the noise figure of the initial stage amplifier is written as $F_1$, initial stage gain as $G_1$, and the noise figure of the next stage amplifier as $F_2$, a total noise figure F may be expressed by the following equation:

$$F = F_1 + \frac{F_2}{G_1} \qquad (7)$$

As may be seen from the above equation, when the gain $G_1$ of the initial stage amplifier becomes large, the influence of the noise figure $F_2$ of the next stage amplifier can be reduced. Meanwhile, as described above, the gain of the circuit depicted in FIG. 2 is large at high frequencies where noise has a large influence. Thus, the amplifier circuit of this invention allows less noise influence by the next stage amplifier than does the circuit illustrated in FIG. 1.

Finally, the overload characteristic of the amplifier will be discussed. Generally, transmission line loss is smaller at low frequencies than at high frequencies. For this reason, the signal spectrum at the input of an initial stage amplifier of a repeater is dominated by low frequency components, together with a small amount of high frequency components. When the initial stage amplifier amplifies all frequencies equally, the low frequency components are unnecessarily amplified, thereby bringing about an overload condition. Therefore, the gain should be made small at low frequencies but large at high frequencies, in order to prevent such an overload of the initial stage amplifier. The gain of the amplifier of this invention is small for a low frequency but large for a high frequency. Therefore the amplifier circuit of this invention is superior also in the overload characteristic over the conventional circuits.

Figure 4:
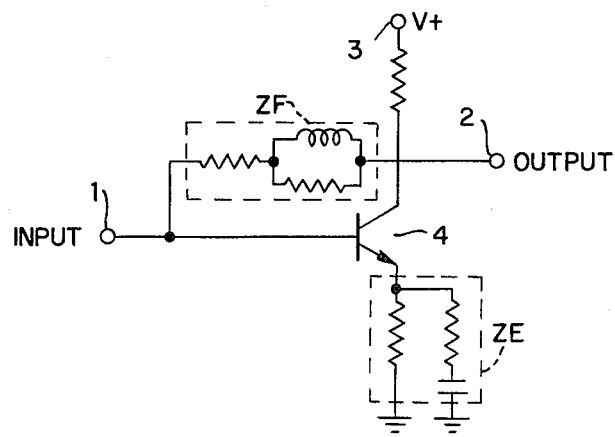
FIG. 4 illustrates another embodiment of the present invention, wherein the parallel impedance element $Z_F$ is configured differently than in the circuit of FIG. 2.
Figure 5:
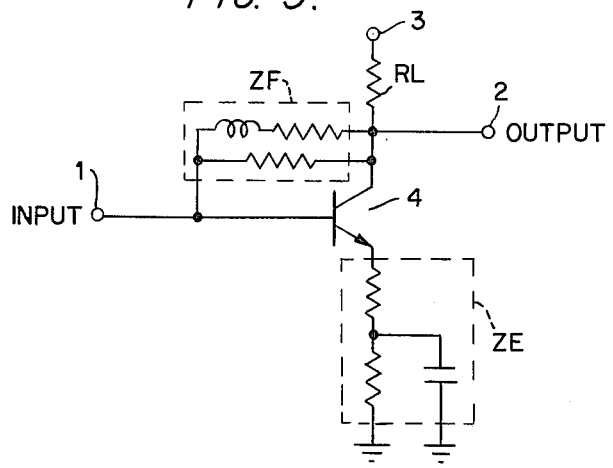
FIG. 5 shows a still further embodiment of the present invention, wherein the series impedance element $Z_E$ is configured differently than in the embodiment of FIG. 2.

Further embodiments of this invention are explained with reference to FIG. 4 and FIG. 5. FIG. 4 shows a structure where the parallel impedance $Z_F$ is modified from that shown in FIG. 2, and FIG. 5 shows a structure where the series impedance $Z_E$ is modified. The parallel impedance $Z_F$ of FIG. 4 is configured as a resistor in series with the parallel circuit of a resistance and an inductance. Series impedance $Z_E$ of FIG. 5 is configured as a resistor in series with the parallel circuit of a resistance and a capacitance.

Figure 6:
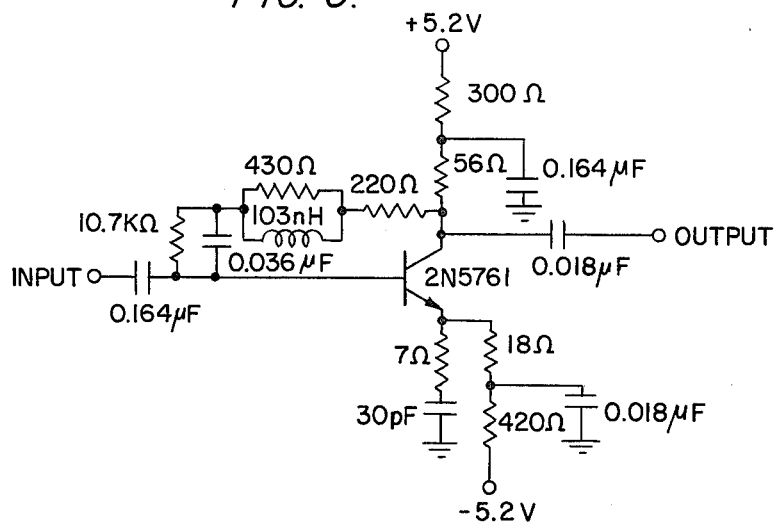
FIG. 6 is a circuit diagram of a still further embodiment of the present invention, in which all component values are specified.
Figure 7:
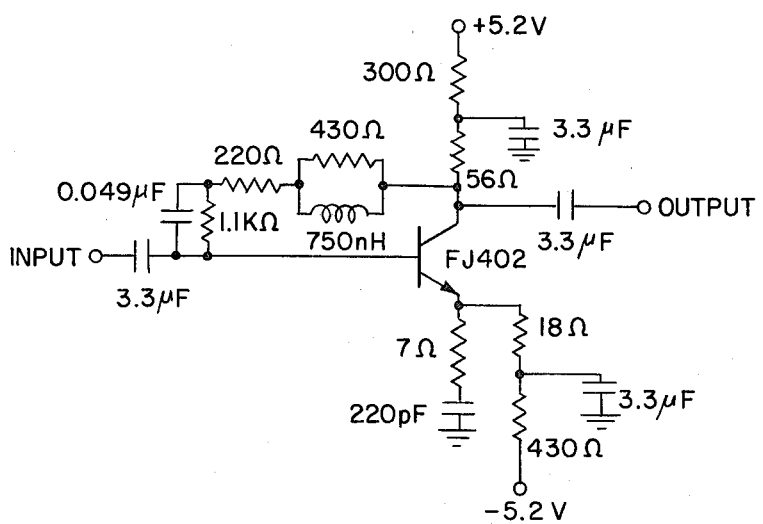
FIG. 7 is a circuit diagram, with fully specified component values, of yet another embodiment of the present invention.
Figure 8:
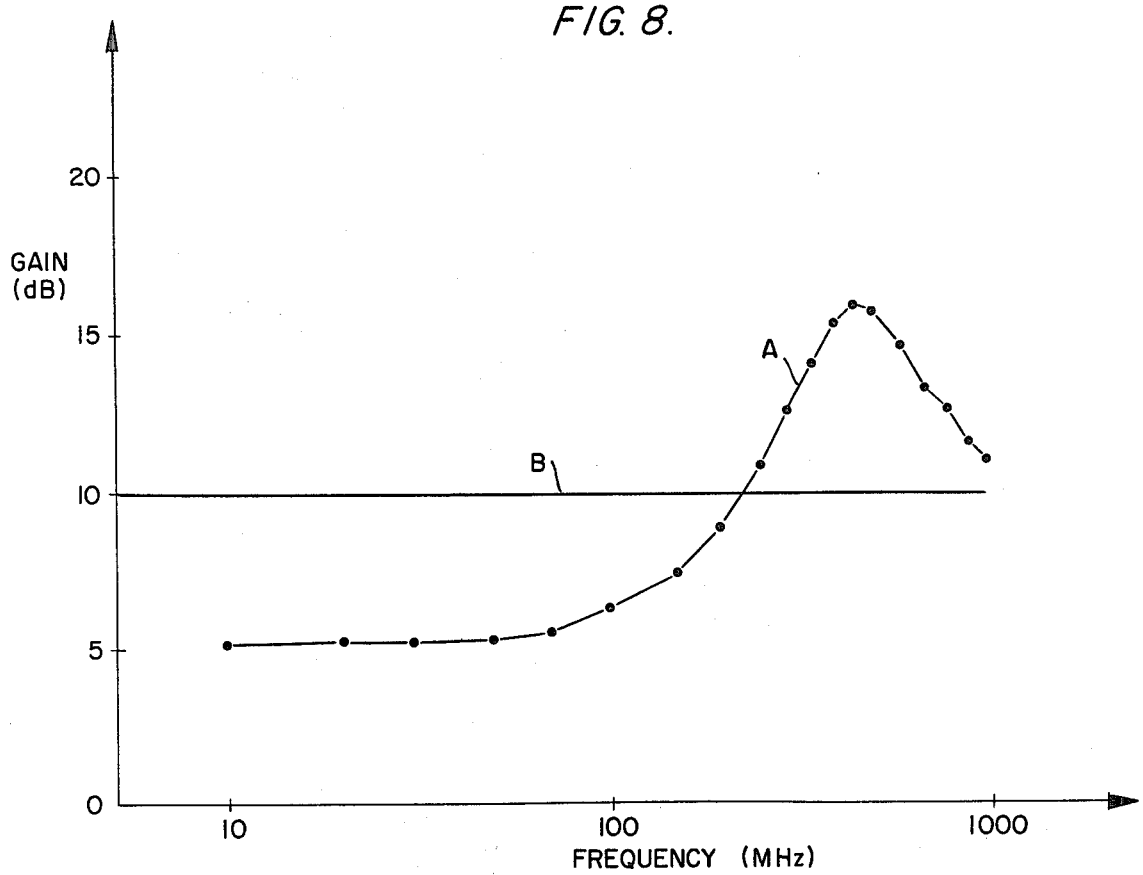
FIG. 8 is a graph of the gain versus frequency characteristics of the circuit shown in FIG. 6.
Figure 9:
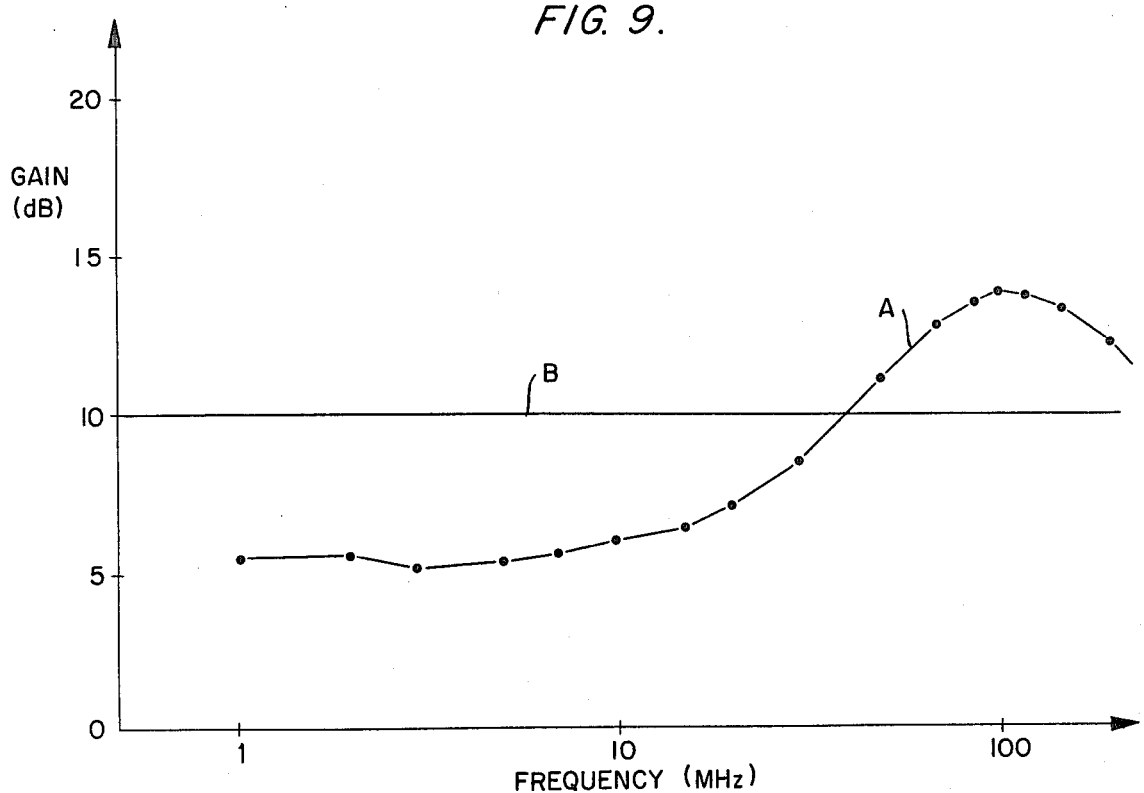
FIG. 9 is a graph of the gain characteristics of the circuit shown in FIG. 7.

Two specific examples of this invention for practical applications are shown in detail in FIG. 6 and FIG. 7. The circuits of both figures are based on the circuit of FIG. 4, and practical values are specified for all components. The transistors 2N5761 (JEDEC) and FJ402 (Fujitsu) are also known in Japan by equivalent designations ECL1444 and 2SC 1930, respectively. The circuit of FIG. 6 is an example of a preamplifier for a repeater to be provided in a transmission line using three levels at a bit rate of 800 Mb/s. The circuit of FIG. 7 is an example of a preamplifier for a repeater for a transmission line using a bipolar signal at a bit rate of 100 Mb/s. The gain characteristic of the circuit of FIG. 6 is shown by curve A in FIG. 8, and the gain characteristic of the circuit of FIG. 7 is shown by curve A in FIG. 9. In FIG. 8 and FIG. 9, the horizontal axis represents frequency (MHz), while the vertical axis represents gain (dB). For comparison, the gain of the conventional circuit of FIG. 1 is indicated in FIGS. 8 and 9 by the curve B.

As may be seen in these figures, the gain of the amplifier according to the present invention is smaller at low frequencies and larger at high frequencies than that of the conventional amplifier. When gain is large, as mentioned above, the noise figure becomes small, and since the frequency range over which the present invention increases gain (as compared to the conventional device) is wider than that over which gain is reduced, the total noise figure is therefore reduced.

As explained above, according to this invention, a low noise amplifier for the intial stage not only provides good impedance matching to the transmission line, because of constant input impedance for a wider frequency band, but also realizes a small noise figure and excellent overload immunity, when formed as, e.g., the embodiment shown in FIG. 2. It will be apparent to those skilled in the art that modifications and variations could be made in the amplifier circuit in accordance with the teaching of this invention without departing from the spirit or scope of the invention. Thus, it is intended that the present invention cover the modifications and variations within the scope of the appended claims and their equivalents.

What is claimed is:
1. A low noise amplifier circuit, comprising:
   a transistor comprising base, emitter, and collector terminals;
   an input terminal connected to said base terminal;
   an output terminal connected to said collector terminal;
   a load resistor connected to said output terminal;
   a first impedance element connected between said base and collector terminals, having a zero, a pole and an impedance with a first constant low value at low frequencies, a second constant high value at high frequencies and increasing smoothly between the first constant low value and the second constant high value over an intermediate range of frequencies; and
   a second impedance element connected between said emitter terminal and ground, having a zero, a pole and an impedance with a first constant high value at the low frequencies, a second constant low value at the high frequencies and decreasing smoothly between the first constant high value and the second constant low value over the intermediate range of frequencies,
   the zero of said first impedance element coincides approximately with the pole of the second impedance element and the pole of the first impedance element coincides approximately with the zero of the second impedance element, and
   the first constant low value of said first impedance element is greater than the first constant high value of said second impedance element.

2. The amplifier circuit of claim 1, wherein said first impedance element comprises an inductor and a first resistor connected in series, and a second resistor connected in parallel with said series combination of said inductor and said first resistor.

3. The amplifier circuit of claim 2, wherein said series impedance element comprises a third resistor and a capacitor connected in series, and a fourth resistor connected in parallel with said series combination of said third resistor and said capacitor.

4. The amplifier circuit of claim 1, wherein said first impedance element comprises a first resistor, and a second resistor and an inductor connected in parallel, said first resistor being connected in series with the parallel combination of said second resistor and said inductor, and wherein said second impedance element comprises a third resistor, and a fourth resistor and a capacitor connected in series, said third resistor being connected in parallel with the series combination of said fourth resistor and said capacitor.

5. The amplifier circuit of claim 1, wherein said first impedance element comprises a first resistor, and a second resistor and an inductor connected in series with said second resistor, said first resistor being connected in parallel with the series combination of said second resistor and said inductor, and wherein said second impedance element comprises a third resistor, and a fourth resistor and a capacitor connected in parallel, said third resistor being connected in series with the parallel combination of said fourth resistor and said capacitor.

* * * * *

UNITED STATES PATENT AND TRADEMARK OFFICE
CERTIFICATE OF CORRECTION

PATENT NO. : 4,370,624

DATED : January 25, 1983

INVENTOR(S) : TAKAO OGAWA ET AL

It is certified that error appears in the above-identified patent and that said Letters Patent is hereby corrected as shown below:

Column 3, line 51, change "high" to --low--.

Signed and Sealed this

Twenty-sixth Day of July 1983.

[SEAL]

Attest:

GERALD J. MOSSINGHOFF

Attesting Officer     Commissioner of Patents and Trademarks